United States Patent [19]

Ueno et al.

[11] 4,366,456
[45] Dec. 28, 1982

[54] SWITCHED-CAPACITOR FILTER

[75] Inventors: Norio Ueno, Kawasaki; Seiji Kato, Yamato; Atsushi Iwata, Tokorozawa, all of Japan

[73] Assignees: Fujitsu Limited, Kawasaki; Nippon Telegraph & Telephone Public Corporation, Tokyo, both of Japan

[21] Appl. No.: 156,389

[22] Filed: Jun. 4, 1980

[30] Foreign Application Priority Data

Jun. 14, 1979 [JP] Japan ................................. 54/74861

[51] Int. Cl.$^3$ ..................... H03H 19/00; H03K 5/153
[52] U.S. Cl. .................................. 333/173; 307/353; 328/151
[58] Field of Search ...................... 333/165, 166–167, 333/173; 328/167, 151; 307/352, 353

[56] References Cited

PUBLICATIONS

"2910 PCM Codec—μLaw 8–Bit Companded A/D and D/A Converter" Intel Corp., Santa Clara, Calif., Jun. 1978; pp. 1–12.

*Primary Examiner*—Marvin L. Nussbaum
*Attorney, Agent, or Firm*—Staas & Halsey

[57] ABSTRACT

A switched capacitor filter having at its input, a signal converter for creating so-called 100% sample and hold signals. The signal converter comprises a plurality of switched capacitors. The switched capacitors, connected in parallel with each other, receive the same successive input signals and supply the so-called 100% sample and hold input signals to the switched-capacitor filter. The switched capacitors, on one hand, charge each of said input signals sequentially and, on the other hand, alternately discharge the respective stored input signals one by one.

13 Claims, 11 Drawing Figures

SWITCHED-CAPACITOR FILTER

BACKGROUND OF THE INVENTION

The present invention relates to a switched-capacitor filter having, at its input, a signal converter for creating so-called 100% sample and hold signals to be supplied to the switched-capacitor filter.

Stimulated by the progress in MOS (metal oxide semiconductor) technology, considerable interest has recently arisen in the possibility of filters realized by means of switched-capacitors, that is, in the switched-capacitor filter (hereinafter often referred to by the abbreviation "SCF"). The major advantages of the SCF reside in the facts that only capacitors, operational amplifiers, and switches are needed, that nearly perfect switches can easily be built, and, especially, that all resonant frequencies are determined exclusively by capacitance ratios. Therefore, the SCF is very useful in various kinds of electronic processing systems, for example, in PCM (pulse code modulation) communication systems. In a PCM communication system, as will be explained hereinafter, a low-pass filter is one of the important electronic processing members. The low-pass filter operates in such a manner as to transfer only signals having frequencies lower than 4 KHz and, accordingly, only voice signals can pass therethrough. In a PCM communication system, it is preferable to build the low-pass filter by means of an SCF.

Although the SCF itself has the above mentioned advantages, it must cooperate with the signal converter to create so-called 100% sample and hold signals, when it is utilized as the low-pass filter in the PCM communication system, especially in a receiver station thereof. Such an SCF usually receives successive sample and hold PAM (pulse amplitude modulation) input signals which are supplied from a digital/analogue converter, i.e. a decoder. The decoder receives the PCM input signal, transmitted via a transmission line, from a transmitter of the PCM communication system. Generally, since the decoder is basically comprised of a sample and hold circuit, the PAM input signal to be supplied to the SCF has a particular constant holding term, which is determined in accordance with the respective sample and hold circuits. In this case, it is a well known fact that undesired distortion frequency characteristics of the output signal from the SCF is produced during application of said PAM input signal to the SCF, which varies proportionately with the holding term due to the so-called aperture effect. Therefore, when the holding term of the PAM input signal varies, the output signal from the SCF also varies due to a variation of the above-mentioned distortion of the PAM input signal. Consequently, there is a shortcoming in that it is difficult to obtain, from the SCF, output signals having the desired filtering characteristic without error.

In order to eliminate the above mentioned shortcoming from the decoder, a signal converter for creating 100% sample and hold PAM input signals, has already been proposed in, for example: INTEL LTD. 2910 PCM CODEC-μLAW, 8-BIT COMPANDED A/D AND D/A CONVERTER; and ISSCC 80/THURSDAY, Feb. 14, 1980/IMPERIAL BALLROOM/3:45 P.M. SESSION XIV: TELECOMMUNICATION CIRCUITS. The proposed signal converter is mainly comprised of a switch, a capacitor, and an operational amplifier, and is located between decoder and the SCF (which will be explained hereinafter). This signal converter is a sample and hold circuit, for so obtaining 100% sample and hold PAM input signals so that a non-holding term is not included therein.

However, the previously proposed signal converter produces the following two defects. One of the defects it that it is difficult to incorporate the signal converter in the SCF on an IC (integrated circuit) as one body. Therefore, the chip size may become large. This is because the capacitor of the proposed signal converter must have a very large capacitance value, for example on the order of several hundreds of pF.

The other defect is that the power consumption of the previously proposed converter is relatively large. This is because, as previously mentioned, the signal converter includes an operational amplifier which requires energizing power.

SUMMARY OF THE INVENTION

Therefore, it is an object of the present invention to provide an SCF having, at its input stage, a signal converter for creating the 100% sample and hold PAM input signals to be supplied to the SCF, which produces neither of the defects mentioned above, and further the signal converter can easily be incorporated in the SCF composed of an IC. The signal converter comprises a plurality of switched capacitors. The switched capacitors, connected in parallel with each other, receive the same successive input signals and supply the so-called 100% sample and hold input signals to the switched-capacitor filter. The switched capacitors, on one hand, charge each of said input signals sequentially and, on the other hand, alternately discharge the respective stored input signals one by one.

BRIEF DESCRIPTION OF THE DRAWING

The present invention will be more apparent from the ensuing description with reference to the accompanying drawings wherein.

DESCRIPTION OF THE PREFERRED EMBODIMENTS

Figure 1:
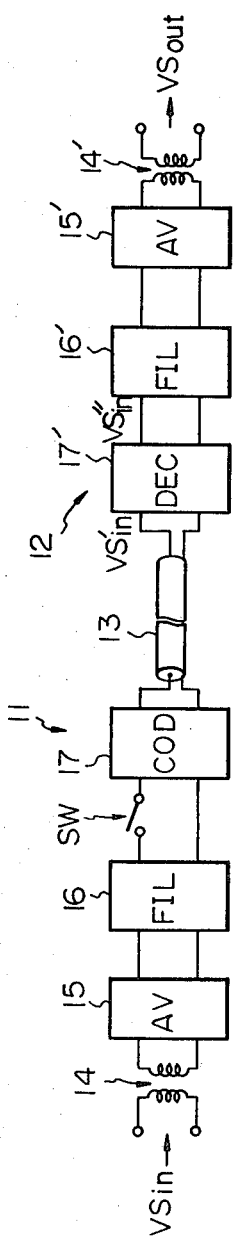
FIG. 1 is a schematic view illustrating a conventional PCM communication system.

In FIG. 1, which is a schematic view of a conventional PCM communication system, the system 10 is divided into a transmitter 11 and a receiver 12. The transmitter 11 and the receiver 12 are connected by way of a transmission line 13. In the transmitter 11, an input voice signal $VS_{in}$ is applied to a transformer 14. The input voice signal is next applied to a PCM channel filter (FIL) 16 via a variable attenuator (AV) 15. The variable attenuator 15 operates in such a manner as to adjust the level of the input voice signal. The analogue signal from the filter 16 is converted into a PCM digital voice signal by means of a coder (COD) 17. The coder 17 receives successive analogue signals via a switch SW. The switch SW is switched ON and OFF at a frequency of 8 KHz, in accordance with the so-called sampling theorem.

In the receiver 12, the input signal $VS'_{in}$, that is the PCM digital voice signal, is decoded by means of a decoder (DEC) 17'. The decoded analogue signal, that is the PAM input signal $VS''_{in}$, is applied to a low-pass filter (FIL) 16' which includes an SCF (switched-capacitor filter).

The filter 16' operates in such a manner as to transfer only signals having frequencies lower than 4 KHz and, accordingly, only voice signals can pass therethrough. An output voice signal $VS_{out}$ is produced from a transformer 14', and a variable attenuator (AV) 15' operates to adjust the level of the output voice signal.

Figure 2:
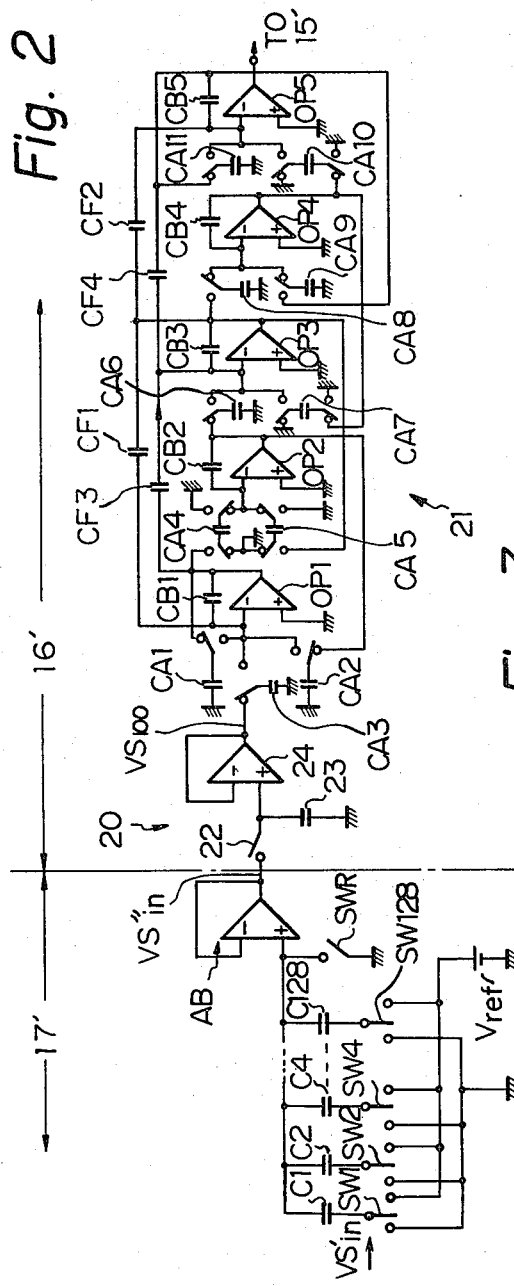
FIG. 2 is a circuit diagram illustrating the decoder 17' and the filter 16' of FIG. 1, where the filter 16' has, at its input stage, a signal converter of the prior art.

The present invention relates to the so-called PCM channel filter of the receiver 12, that is the filter 16'. As previously mentioned, the filter 16' must cooperate with a signal converter for creating the above mentioned 100% sample and hold signals. The 100% sample and hold signals will be discussed with reference to FIG. 2. FIG. 2 is a circuit diagram illustrating details of the decoder 17' and the filter 16' shown in FIG. 1. The filter 16' has, at its input stage, a signal converter 20 of the prior art. Thus, the filter 16' may be divided into an SCF 21 and the signal converter 20. The present invention is specifically directed to improvement of the signal converter 20. In this figure, the conventional decoder 17' receives the input signal $VS'_{in}$, that is the PCM input signal, from the transmitter 11 (FIG. 1) via the transmission line 13 (FIG. 1). The decoder 17' is comprised of a plurality of capacitors C1, C2, C4 . . . C128, a plurality of switches SW1, SW2, SW4 . . . SW128, a reset switch SWR, a reference voltage source Vref, and a buffer amplifier AB. The SCF 21 receives, via the signal converter 20, the PAM input signal $VS''_{in}$ produced from the decoder 17'. The signal converter 20 produces the so-called 100% sample and hold signal $VS_{100}$ to be applied to the SCF 21. The SCF 21 functions to transfer only the frequency components below 4 KHz of the signals $VS_{100}$.

Since the present invention refers not to the SCF 21 itself but to the signal converter 20, and since the SCF 21 is known from publications, for example, David J. Allstot et al.: "Fully-Integrated High-Order NMOS Sampled Data Ladder Filters", ISSCC 78, P. 82, details of the operation of the SCF 21 will not be explained here. As seen from FIG. 2, the reference symbols OP1 through OP5 represent operational amplifiers. These five operational amplifiers compose a five order low pass SCF. The reference symbols CB1 through CB5 represent integration capacitors. The reference symbols CA1 through CA11 represent switched capacitors acting as resistors. The reference symbols CF1 through CF4 represent feedback capacitors.

Figure 3:
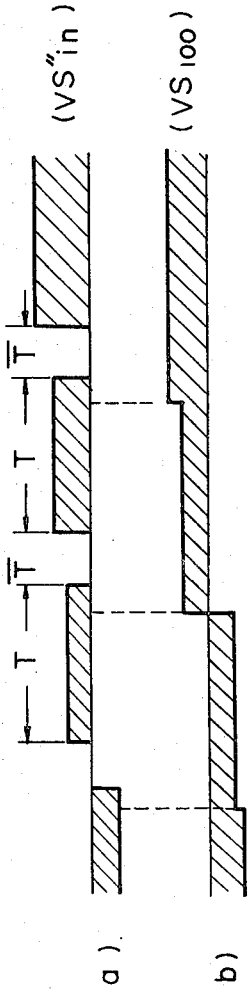
FIG. 3 depicts the waveform of a PAM input signal $VS''_{in}$ and the waveform of a so-called 100% sample and hold input signal $VS_{100}$, both shown in the circuit of FIG. 2.

The signal converter 20 operates so as to convert the waveform of the PAM input signal $VS''_{in}$ to the 100% sample and hold PAM input signal $VS_{100}$. The waveform of the PAM input signal $VS''_{in}$ is depicted in row (a) of FIG. 3, and the waveform of the 100% sample and hold PAM input signal $VS_{100}$ is depicted in row (b) of FIG. 3. In row (a) of FIG. 3 each of the signals $VS''_{in}$ is composed of a holding term T during which the signal is transferred, and a non-holding term $\overline{T}$ during which the signal is not transferred. One of the non-holding terms $\overline{T}$ is produced every time the capacitors of the decoder 17' discharge the respective stored signal $VS''_{in}$ via the reset switch SWR. However, as previously mentioned, if the signal $VS''_{in}$ is directly applied to the SCF 21, the SCF 21 will produce a filtered output signal which includes undesired distortion of the frequency characteristics, due to the presence of the non-holding terms $\overline{T}$. This is the reason why the signal converter 20 must be incorporated in the SCF 21 at its input stage to convert the waveform of the signal $VS''_{in}$ to the waveform of the signal $VS_{100}$ which includes no non-holding terms $\overline{T}$, as shown in FIG. 3. However, since the known signal converter 20 is comprised of a switch 22, a capacitor 23, and an operational amplifier 24 acting as a buffer amplifier, the two defects previously mentioned are produced. The switch 22 is switched ON and OFF in synchrony with the sampling operation conducted in the decoder 17' (FIG. 2), that is, at the sampling frequency of 8 KHz. The capacitor 23 acts as a sample and hold capacitor.

Figure 4:
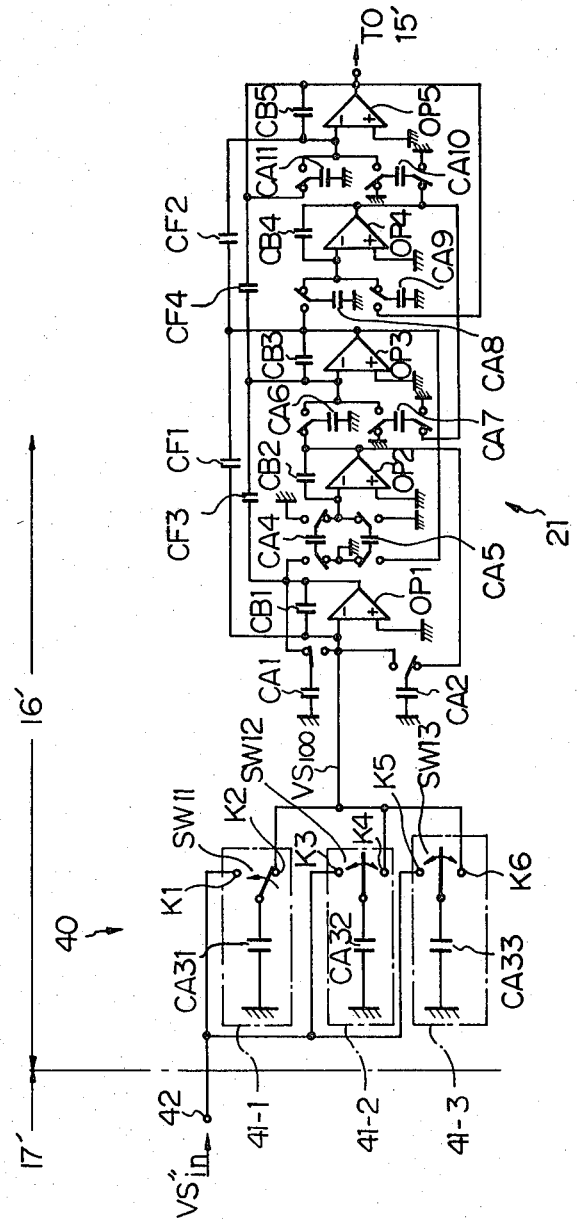
FIG. 4 is a circuit diagram of a first embodiment of the present invention.

In the known present invention, the signal converter 20 is improved so as to cancel the above mentioned defects. FIG. 4 is a circuit diagram of a first embodiment of the present invention. The members represented by the same reference numerals and symbols are identical with those of FIG. 2. As seen from FIG. 4, a signal converter 40 according to the present invention is comprised of a plurality of switched capacitors, for example three switched capacitors 41-1, 41-2, and 41-3. The switched capacitor 41-1 is comprised of a capacitor CA31 and a switching means SW11. Similarly, the switched capacitors 41-2 and 41-3 are respectively comprised of both a capacitor 41-2 and a switching means SW12 and both a capacitor 41-3 and a switching means SW13. It should be noted that the entry switched capacitor including the capacitor CA3 (see FIG. 2) which was located at the input of the SCF 21, has been deleted; this entry switched capacitor has been transformed to the switched capacitors (41-1 through 41-3) which act as the signal converter 40.

Figure 5:
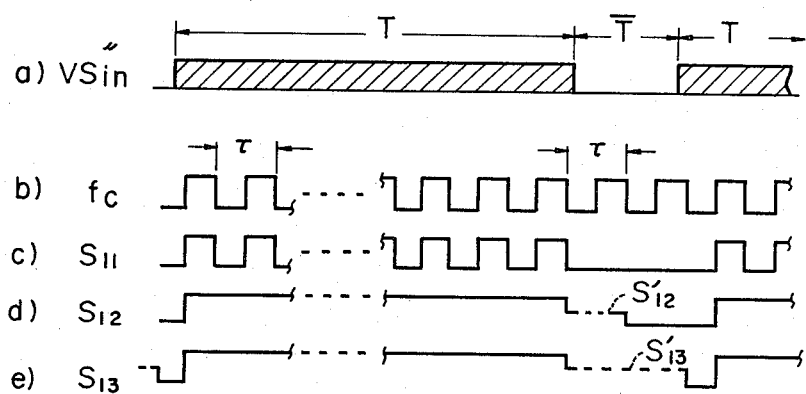
FIG. 5 depicts timing charts, used for explaining the operation of the circuit shown in FIG. 4.

Signal conversion by means of the signal converter 40 will be clarified with reference to timing charts depicted in FIG. 5. The signal $VS''_{in}$ is depicted in row (a) of FIG. 5 (corresponding to the row (a) of FIG. 3). The signals $VS''_{in}$ are successive sampled and held signals with the sampling frequency equal to 8 KHz. The ratio between the holding term T and the non-holding term $\overline{T}$, that is $T/\overline{T}$, is, for example, 7/1. Row (b) depicts a waveform of constant clock pulses at a frequency ($f_c$) of, for example, 128 KHz. The constant clock pulses are very important to drive the SCF 21, especially to switch the switching means of respective switched capacitors including CA1, CA2, CA4 . . . CA11. Row (c) depicts a timing signal ($S_{11}$) which drives the switch SW11 of the switched capacitor 41-1. When the timing signal $S_{11}$ is the logic "1", the switch SW11 contacts a contact K1, and when the signal $S_{11}$ is the logic "0", the switch SW11 contacts a contact K2. Therefore, the switch SW11 alternately contacts the contacts K1 and K2, in synchrony with the constant clock pulses having the frequency $f_c$. Row (d) depicts a timing signal $S_{12}$ which drives the switch SW12 of the switched capacitor 41-2. Row (e) depicts a timing signal $S_{13}$ which drives the switch SW13. When the timing signals ($S_{12}$, $S_{13}$) are the logic "1", the switches (SW12, SW13) contact contacts K3 and K5 respectively, while when the timing signals ($S_{12}$, $S_{13}$) are the logic "0", the switches (SW12, SW13) contact contacts K4 and K6 respectively. It should be noted that the switches (SW12, SW13) can be in a floating status. That is, the switches (SW12, SW13) may contact neither the contacts (K3, K5) nor the contacts (K4, K6). Such a floating status is achieved when timing signals $S'_{12}$ and $S'_{13}$, indicated by dotted lines in rows (d) and (e), appear. Regarding the switched capacitor 41-1, the contact K1 is connected to an input terminal 42 and receives the PAM input signal $VS''_{in}$, and the contact K2 is connected to the input of the SCF 21. Accordingly, the switched capacitor 41-1 charges the signal $VS''_{in}$ and discharges the stored signal under the control of the timing signal $S_{11}$ (see row (c)). Thus, the switched capacitor 41-1 achieves the same function as that of the conventional entry switched capacitor, including the capacitor CA3 (FIG. 2). In this case, the switched capacitor 41-1 receives the signal $VS''_{in}$ only during the holding term T (see rows (a) and (c)) and supplies the signal $VS''_{in}$ to the SCF 21. Therefore, no 100% sample and hold signal, such as shown in row (a) of FIG. 3, is obtained.

However, the signal $VS''_{in}$ can still be supplied, during the non-holding term $\overline{T}$, to the SCF 21 by means of the switched capacitors 41-2 and 41-3. The capacitor CA32 of the switched capacitor 41-2 samples and holds the signal $VS''_{in}$, via the contact K3, during the holding term T (see rows (a) and (d) of FIG. 5). Thereafter, during the non-holding term $\overline{T}$, the stored signal in the capacitor CA32 is kept as it is, due to the floating status SW12 (see $S'_{12}$), but the stored signal is discharged to the SCF 21 in synchrony with the first clock pulse ($f_c$) appearing during the non-holding term $\overline{T}$. Similarly, the stored signal $VS''_{in}$ in the capacitor CA33 is discharged to the SCF 21 in synchrony with the second clock pulse ($f_c$) appearing during the non-holding term $\overline{T}$. Thus, the signal $VS''_{in}$ can be supplied to the SCF 21 during the non-holding term $\overline{T}$ by means of the switched capacitors 41-2 and 41-3, as occurs during the holding term T by means of the switched capacitor 41-1.

The capacitors CA31, CA32, and CA33 have the same capacitance value "C". Accordingly each of the capacitors CA31, CA32, and CA33 stores a charge "Q", which varies in proportion to the voltage level "$V_1$" of the signal $VS''_{in}$ according to the well known equation $Q = C \cdot V_1$. The charges "Q" of the respective capacitors CA31, CA32, and CA33 are discharged, sequentially, to the integration capacitor CB1 of the SCF 21. During the holding term T, the capacitor CA31 discharges the charges "Q" to the integration capacitor CB1 every time one period $\tau$ of said clock pulses ($f_c$) elapses. The period $\tau$ is defined by the equation $\tau = 1/f_c$. In this first embodiment, the capacitor CA31 discharges the charges "Q" fourteen times during one holding term T. On the other hand, during the non-holding term $\overline{T}$, the capacitors CA32 and CA33 sequentially discharge respective charges "Q" to the integration capacitor CB1, every time one period of the clock pulses ($f_c$) elapses. In this first embodiment, each of the capacitors CA32 and CA33 discharges the charge "Q" once, and accordingly the capacitors CA31, CA32 and CA33 discharge respective charges "Q" sixteen times during one holding term T and one non-holding term $\overline{T}$. The number sixteen is derived from the expression 128/8, where the number 128 corresponds to the frequency of the clock pulses in the SCF 21 and the number 8 corresponds to the frequency of the sampling frequency in the decoder 17'. Thus, the same charges "Q" are discharged sixteen times to the integration capacitor CB1 in synchrony with the clock pulses. As a result, the 100% sample and hold PAM input signal $VS_{100}$ is obtained from the signal converter 40.

Figure 6:
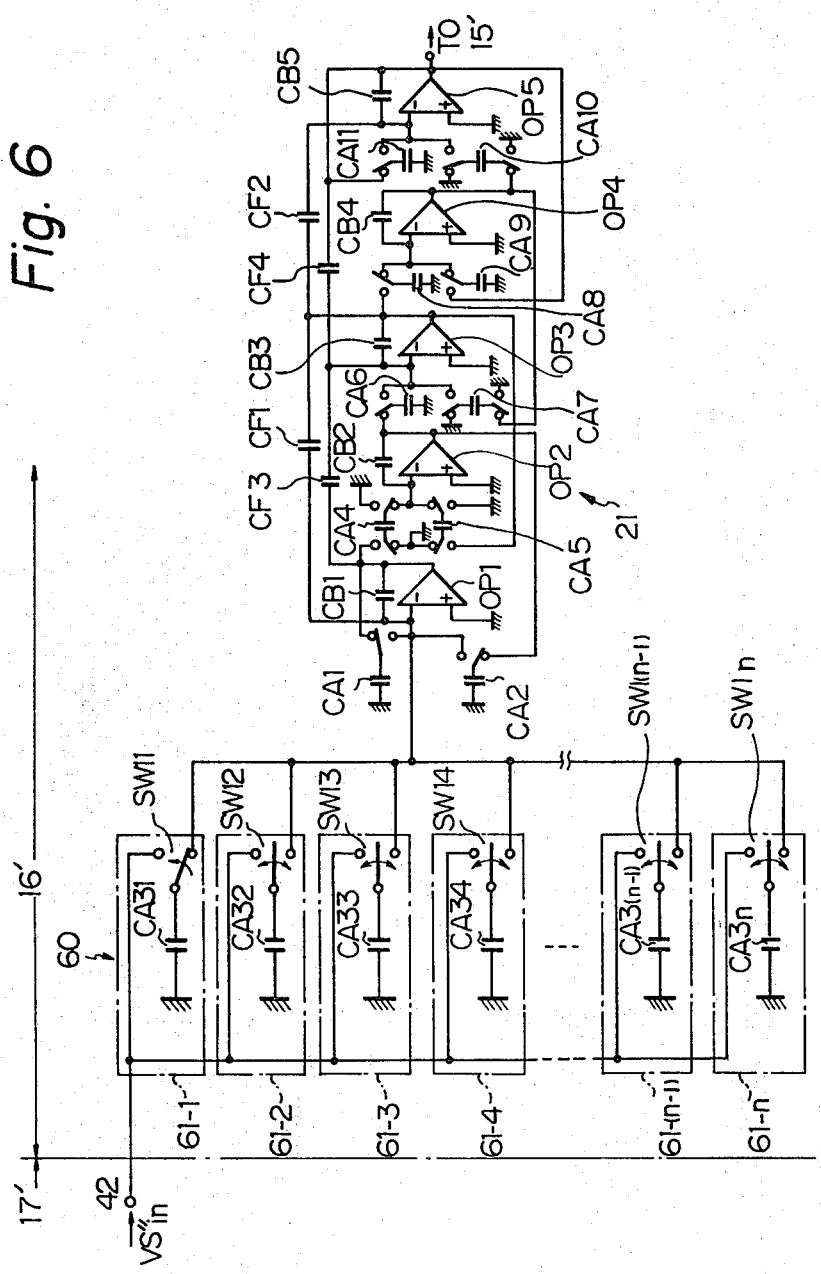
FIG. 6 is a circuit diagram of a second embodiment of the present invention.

FIG. 6 is a circuit diagram of a second embodiment of the present invention. In FIG. 6, the members represented by the same reference numerals and symbols are identical with those of FIG. 4. In the second embodiment, there are n units of switched capacitors 61-1, 61-2, 61-3, 61-4 . . . 61-n. The switched capacitors 61-1 through 61-n are comprised of capacitors CA31 through CA3n and switching means SW11 through SW1n, respectively. These switched capacitors comprise a signal converter 60. The switching means SW11 through SW1n are driven by timing signals $S_{11}$ through $S_{1n}$, respectively. The waveforms thereof are depicted in rows (a) through (f) of FIG. 7. Row (g) thereof depicts a waveform of said constant clock pulses (corresponding to row (b) of FIG. 5). When the timing signals ($S_{11}$ through $S_{1n}$) are the logic "1", the corresponding switching means (SW11 through SW1n) contact the respective upper contacts, such as the contacts K1, K3, K5 of FIG. 4, and store the signal $VS''_{in}$ in respective capacitors (CA31 through CA3n). When the timing signals are the logic "0", the corresponding switching means (SW11 through SW1n) contact the respective lower contacts, such as the contacts K2, K4, K6 of FIG. 4 and discharge respective stored signals $VS''_{in}$ from the capacitors CA31 through CA3n to the integration capacitor CB1 of the SCF 21. The switching means SW12 through SW1n are caused to be in a floating status by timing signals $S'_{12}$ through $S'_{1n}$, indicated by dotted lines.

Figure 7:
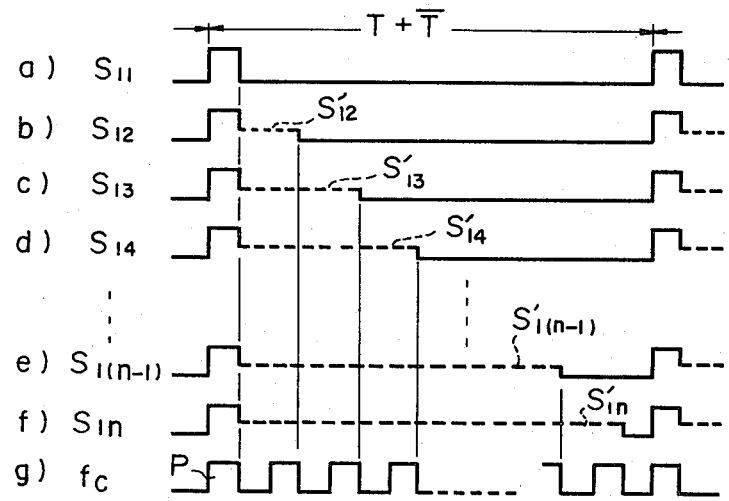
FIG. 7 depicts timing charts, used for explaining the operation of the circuit shown in FIG. 6.

All the capacitors CA31 through CA3n charge the signal $VS''_{in}$ at the same time, in synchrony with the first clock pulse P (see row (g) of FIG. 7) appearing in each set of the holding term T and the non-holding term $\overline{T}$, that is the period (T+$\overline{T}$) shown in FIG. 7. Thereafter, the capacitors CA31 through CA3n discharge their respective stored signals $VS''_{in}$ sequentially to the integration capacitor CB1 of the SCF 21, in synchrony with the clock pulses having the frequency $f_c$. In this case, all the capacitors CA31 through CA3n should have the same capacitance value, so as to transfer the same charge "Q" of the signal $VS''_{in}$ to the capacitor CB1. Thus, the charges "Q" are uniformly distributed to the capacitor CB1 without any non-holding interval during the period (T+$\overline{T}$), and accordingly the 100% sample and hold PAM input signal $VS_{100}$ can be obtained. When the clock pulses ($f_c$) have the frequency of 128 KHz and the sampling frequency is 8 KHz, sixteen switched capacitors 61-1 through 61-16 (n=16) are required for constructing the signal converter 60, where the number 16 is derived from the expression 128/8.

It should be understood that the signal converter (60) can also deal with a continuous wave signal.

Figure 8:
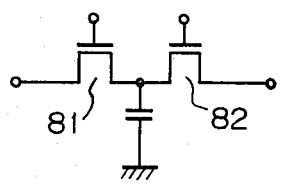
FIG. 8 is a circuit diagram illustrating the construction of an actual switched capacitor.
Figure 9:
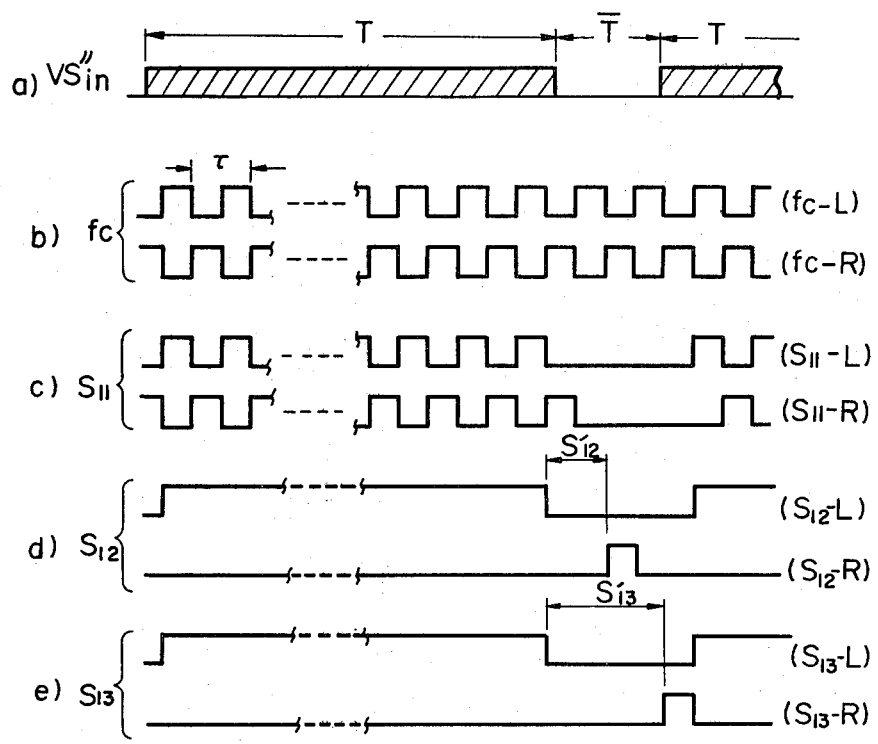
FIG. 9 depicts timing charts, used for explaining the operation of the circuit shown in FIG. 4, when each of the switched capacitors is constructed as shown in FIG. 8.

Each of the above mentioned switched capacitors (61-1 through 61-n) is comprised of a capacitor and a switching means. The switching means may be fabricated by two FETs (field effect transistors). FIG. 8 is a circuit diagram illustrating an actual construction of the switched capacitor. In this figure, FETs 81 and 82 form the switching means. The gates of the FETs 81 and 82 receive corresponding timing signals, shown as $S_{11}$, $S_{12}$ ... in FIG. 9. The left FETs (81) are turned ON and OFF by respective signals, such as $f_c$-L, $S_{11}$-L, $S_{12}$-L and $S_{13}$-L. Similarly right FETs (82) are turned ON and OFF by respective signals, such as $f_c$-R, $S_{11}$-R, $S_{12}$-R and $S_{13}$-R.

Figure 10:
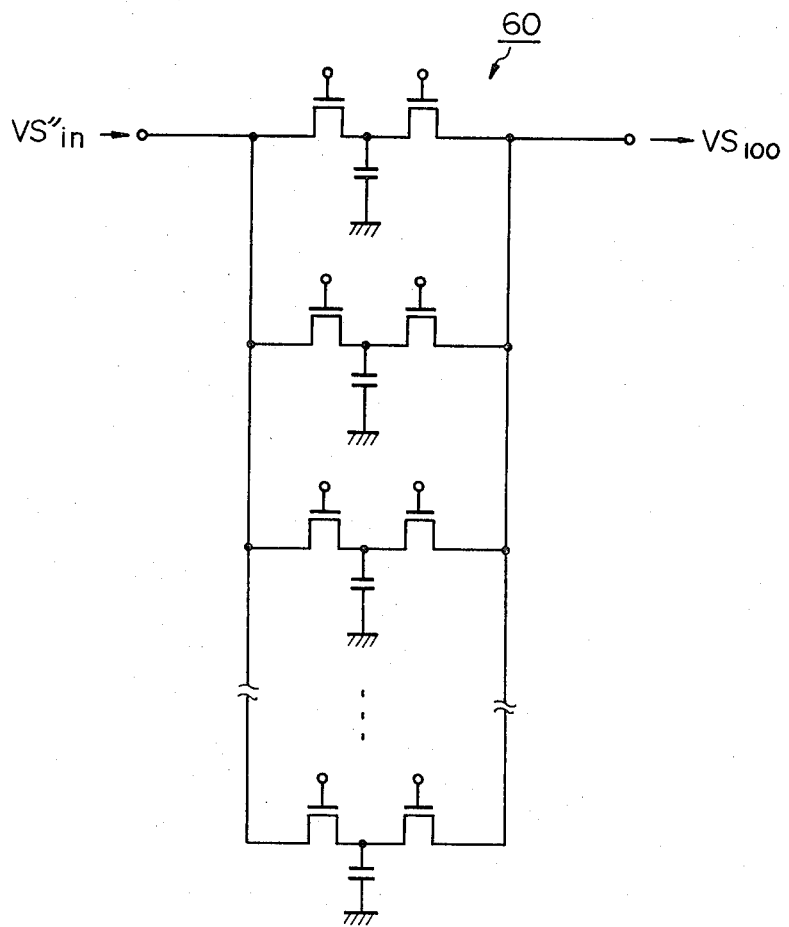
FIG. 10 is a circuit diagram illustrating the actual construction of a signal converter 60 as shown in FIG. 6.
Figure 11:
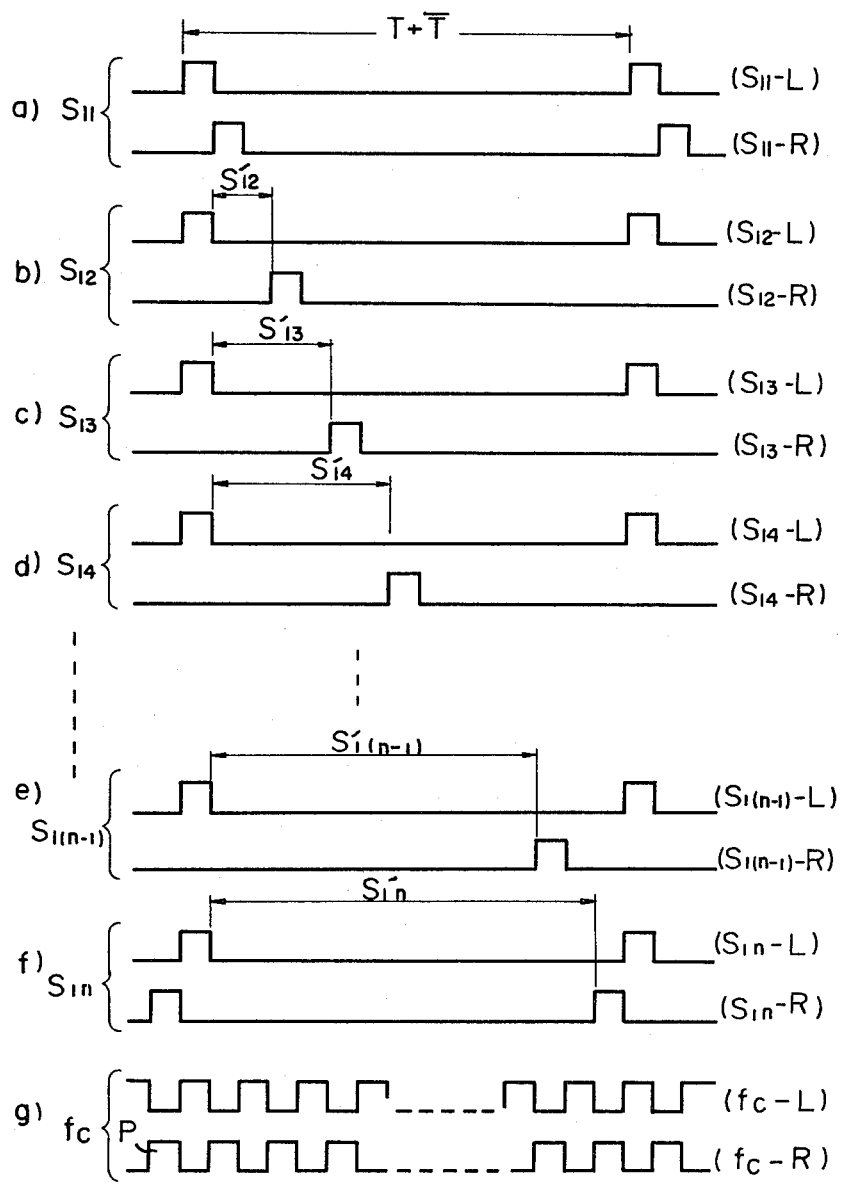
FIG. 11 depicts timing charts, used for explaining the operation of the circuit shown in FIG. 6, when each of the switched capacitors is constructed as shown in FIG. 8.

FIG. 10 is a circuit diagram illustrating an actual construction of the signal converter 60 shown in FIG. 6, by using the switched capacitors each having the same construction as shown in FIG. 8. In FIG. 10, the gate of each of the FETs receives a respective timing signal supplied from a switching controller (not shown). The switching controller produces the timing signals shown in FIG. 11. The meanings of $S_{11}$-L, $S_{12}$-L ... and $S_{11}$-R, $S_{12}$-R ..., are the same as those in FIG. 9. Since such a switching controller can easily be made by a person skilled in the art, the details of the switching controller are not mentioned.

As mentioned above, according to the present invention, the signal converter can be fabricated solely from simple electronic elements, such as switched capacitors, without using an operational amplifier or a capacitor having extremely large capacitance value, and thereby the two defects discussed above are avoided.

We claim:

1. A signal converter for receiving a succession of input signals and converting same for transfer to a switched capacitor filter, said converter being driven by constant frequency clock pulses and comprising:
   a plurality of switched capacitors connected in parallel with each other, each said switched capacitor comprising a capacitor and associated switching means connected in series,
   wherein each of the switched capacitors receives the same successive input signals to be transferred, each of said input signals comprising both a holding term for transferring the input signal and a non-holding term for not transferring the input signal,
   wherein said switched capacitors store said input signals during the holding term in synchrony with said clock pulses,
   and wherein the switched capacitors discharge respective stored input signals sequentially, during both said holding term and said non-holding term, in synchrony with said clock pulses.

2. A converter as set forth in claim 1,
   wherein said switched capacitors comprise a first switched capacitor and other switched capacitors,
   wherein said first switched capacitor stores and discharges each of said input signals alternately, during the holding term, in synchrony with said clock pulses,
   and wherein the others of said switched capacitors store each of said input signals during the holding term, but discharge the respective stored input signals, during the non-holding term, sequentially one by one in synchrony with the clock pulses.

3. A converter as set forth in claim 1,
   wherein all of said switched capacitors initially charge said input signal simultaneously when the first one of said clock pulses appears during the holding term,
   and wherein the switched capacitors thereafter discharge respective stored input signals sequentially one by one, during both the holding term and the non-holding term, in synchrony with the following said clock pulses.

4. A converter as set forth in claim 1, wherein said switching means of each said switched capacitor comprises two FETs (field effect transistors) connected in series, said associated capacitor being connected, at one terminal thereof, to the middle point between said FETs, wherein one of the said FETs receives said input signals and the other thereof provides output signals to be transferred to the switched-capacitor filter.

5. A signal converter, comprising:
   input means for receiving an input signal which comprises both a holding term and a non-holding term;
   means for receiving a clock signal;
   an output terminal;
   first switched-capacitor means, operatively connected to said input means, for sampling said input signal synchronously with said clock signal during said holding term of said input signal, and for transferring to said output terminal during said holding term of said input signal an output signal proportional to said input signal; and
   one or more other switched-capacitor means operatively connected to said input means and to said output terminal, for sampling said input signals during said holding term thereof, and for transferring to said output terminal successively, in synchrony with successive clock pulses during said non-holding term of said input signal, respective output signals proportional to the value of said input signal during said holding term in which said input signal was sampled by said respective one or more other switched-capacitor means.

6. The converter of claim 5, wherein each of said switched capacitor means comprises:
   a capacitor connected to ground;
   a first FET transistor, connected between said capacitor and said input means; and
   a second FET transistor, connected between said capacitor and said output terminal.

7. The converter of claim 6, wherein each said FET transistor further comprises a gate, and further comprising means for providing signals to said gates of said respective FETs for connecting said respective capacitor to said input means or to said output terminal respectively.

8. The converter of claim 6, wherein said respective capacitors of all said switched capacitor means are equal in capacitance.

9. The converter of claim 7 or 8, comprising exactly two of said other switched-capacitor means, wherein the duration of said holding term of said input signal is approximately 7 times that of said non-holding term of said input signal.

10. A signal converter, comprising:
    input means for receiving an input signal, said input signal comprising both a holding term and a non-holding term;
    an output terminal; and a plurality of switched capacitors connected in parallel, each said respective switched capacitor comprising:

a capacitor; and means for connecting said capacitor to said input means at the beginning of each said holding term of said input signal, and for connecting said capacitor of each said respective switched capacitor to said output terminal sequentially during the remainder of said holding term and the succeeding non-holding term of said input signal.

11. The converter of claim 10, wherein each said switched capacitor means comprises first and second FETs, respectively connected between said capacitor and said input means, and between said capacitor and said output terminal.

12. The converter of claim 11, wherein said first and second FETs each comprises respective gates, and further comprising means, connected to said respective gates of said FETs, for making said respective FETs selectively conductive to connect said respective capacitors to said means for receiving input signals or to said output terminal respectively.

13. The converter of claim 10, wherein said respective capacitors of all said switched capacitors are equal in capacitance.

* * * * *

UNITED STATES PATENT AND TRADEMARK OFFICE
CERTIFICATE OF CORRECTION

PATENT NO. : 4,366,456

DATED : December 28, 1982

INVENTOR(S) : Ueno et al.

It is certified that error appears in the above-identified patent and that said Letters Patent is hereby corrected as shown below:

Column 2, line 14, after "proposed" insert --signal--.

Signed and Sealed this

Sixth Day of October, 1987

Attest:

DONALD J. QUIGG

*Attesting Officer*       *Commissioner of Patents and Trademarks*